United States Patent
Tseng

(10) Patent No.: US 7,224,212 B2
(45) Date of Patent: May 29, 2007

(54) LOW PASS FILTER DE-GLITCH CIRCUIT

(75) Inventor: Po-Yu Tseng, Hsin Tien (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/973,386

(22) Filed: Oct. 27, 2004

(65) Prior Publication Data

US 2005/0151583 A1 Jul. 14, 2005

(30) Foreign Application Priority Data

Jan. 9, 2004 (TW) .............................. 93100529 A

(51) Int. Cl.
*H03K 5/00* (2006.01)
(52) U.S. Cl. ........................ 327/551; 327/198; 327/379
(58) Field of Classification Search .................. 327/34, 327/551–558, 379, 384
See application file for complete search history.

(56) References Cited

U.S. PATENT DOCUMENTS

| | | | | |
|---|---|---|---|---|
| 5,479,132 A | * | 12/1995 | Verhaeghe et al. | 327/553 |
| 5,703,416 A | * | 12/1997 | Hinkle et al. | 307/89 |
| 5,990,753 A | * | 11/1999 | Danstrom et al. | 331/143 |

* cited by examiner

*Primary Examiner*—Dinh T. Le
(74) *Attorney, Agent, or Firm*—Troxell Law Office, PLLC

(57) ABSTRACT

A low pass filter de-glitch circuit is disclosed herein, it includes a first short pulse resetting circuit, a second short pulse resetting circuit having MOS transistors and a low pass filtering circuit having a capacitor coupled with an inverter. Forgoing circuits are cascode together and then connected to a buffer. The buffer provides two complementary signals which are served as control signals feedbacked to the first short pulse resetting circuit and the second short pulse resetting circuit. Utilizing the driving large current capability the MOS transistors have, the low pass filter de-glitch circuit can reset the capacitor rapidly. Therefore the circuit can filter those glitch signals.

12 Claims, 4 Drawing Sheets

LOW PASS FILTER DE-GLITCH CIRCUIT

TECHNICAL FIELD

This invention relates to a circuit, more particularly, as it coupled to a low pass filter, and fed with a pair of complementary signals, the circuit can filter the pulse having pulse width narrower than a specific value, additionally, the circuit can pass through the signal having pulse width wider than a specific value.

BACKGROUND

In the integrated circuit it is well known that input/output (I/O) pad acts as a bridge communicating one chip between another. Specifically, the I/O pad function as a buffer, as shown in FIG. 1a, with input terminal A and output terminal Z. The buffer's operation is, for example, imposing a signal on terminal A, and a signal having the same pulse width will appear on terminal Z with a delay of several neon-seconds. So the I/O pad dose not perform filtering.

As shown in FIG. 1b, a capacitor C is coupled in-between to an inverter set including two series connected inverters, the inverter set has an input terminal A, an output terminal Z. The terminal voltage of the capacitor C to ground is denoted as $V_{CP}$, the voltage on terminal A is $V_A$, and the voltage at terminal Z is $V_Z$. It tends to malfunction if coupling the I/O pad to a low pass element to filter output signal. For example, if the device (including the capacitor C and the inverter set) in FIG. 1b is designed to filter the pulse having pulse width smaller than 20 ns (nano-seconds), it is inclined to malfunction due to the situation described below. After the pulse H1, having pulse width 15 ns, has passed through the first inverter INV1, the capacitor C is charged to $V_{CP}$, however, $V_{CP}$ dose not reach the threshold voltage $V_{TH}$ of the second inverter INV2, so the voltage on the output terminal remains unchanged (equal to 0), and the pulse H1 had been filtered at this time. Subsequently, $V_A$ returns to its' original level (e.g. 0) for a time duration L (e.g. 5 ns), and then the capacitor C, within time duration L, discharges through the first inverter INV1. If the capacitor C is not completely discharged within time duration L, and a second pulse H2 following L is applied on terminal A, the terminal voltage $V_{CP}$ of capacitor C starts to rise before it return to 0, so $V_{CP}$ tends to reaches $V_{TH}$ even if the pulse of the input pulse H2 is smaller than 20 ns. Thus the voltage $V_Z$ on the output terminal Z reaches a certain level other than its' original one (0), however, it is expected that, as long as the pulse width of the input pulse H2 is smaller than 20 ns, the output voltage $V_Z$ should remain unchanged. In other words, the low pass characteristic of the device in FIG. 1b (including inverter INV1 connected to capacitor C and inverter INV2) disappeared due to the residual charges on capacitor C, which relates to the time duration L between input pulse H1 and pulse H2. Take the time duration L as 5 ns as an example, as shown in FIG. 1b, while the rear half (around 10 ns) of pulse H2 starts to be applied on terminal A, because $V_{CP}$ begin to exceeds $V_{TH}$ ($V_{CP}>V_{TH}$), a signal expected to be filtered, unexpectedly appears at the output terminal Z.

Due to the disadvantages mentioned above, the improvement can be made by a circuit which utilizes feed back signal to reset timing pulse, and uses MOS (Metal-Oxide-Semiconductor) transistor to enable large current drivability. Thus the fast charging/discharging operation is made possible, and the problems resulted from residual charges is being prevented.

SUMMARY OF THE INVENTION

This invention disclosed a de-glitch circuit, which can be used to remove glitch, the de-glitch circuit according to one of the preferred embodiments of the present invention includes an input terminal inverting device, an output buffer set, a low pass filter, a first glitch reset circuit and a second glitch reset circuit. The foregoing output buffer set is used to generate a first feedback signal and a second feedback signal, the first feedback signal and the second feedback signal are complementary.

The low pass filter mentioned above includes a capacitor and a first inverter. The first inverter is coupled to the input terminal inverting device, and one terminal of the capacitor is grounded, the other terminal of the capacitor is coupled to the input terminal of the output buffer set. The first glitch reset circuit has a first input terminal coupled to the input terminal inverting device, and the first output terminal coupled to the input terminal of the output buffer set. The first glitch reset circuit also includes a first NMOS transistor, a second NMOS transistor and a first transmission gate having two control gates controlled by the first feedback signal and the second feedback signal respectively. The second glitch reset circuit has a second input terminal coupled to the input terminal inverting device, the second glitch reset circuit also has a second output terminal coupled to the input terminal of the output buffer set, thus providing a rapid charging path for the capacitor. The second glitch reset circuit further includes a first PMOS transistor, a second PMOS transistor, and second transmission gate.

The first feedback signal controls the N control gate of the first transmission gate, and the second feedback signal controls the P control gate of the first transmission as well as the gate of the first NMOS transistor respectively. The first feedback signal also controls the P control gate of the second transmission gate, and the second feedback signal also controls the N control gate of the second transmission gate as well as the gate of the first PMOS transistor. When the first transmission gate is off (electrically open), the first NMOS transistor will be turned on and grounded, thus the second NMOS transistor will also be turned off. Similarly, when the second transmission gate is off, the first PMOS transistor will be turned on and couple the power supply ($V_{DD}$) to the gate of the second PMOS transistor, thus shut down (turn off) the second PMOS transistor.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

As described in the prior art, when two or more glitches (high frequency noise is a kind of glitch) are close enough, and a simple RC (Resistor Capacitor) low pass circuit is used to filter high frequency noise, because the capacitor do not have enough time to completely discharge, the following short-pulse-width signal (glitch) is enabled to pass the filter, thus resulted malfunction. The circuit according to one of the preferred embodiments of the present invention can avoid the foregoing disadvantages.

Figure 1A:
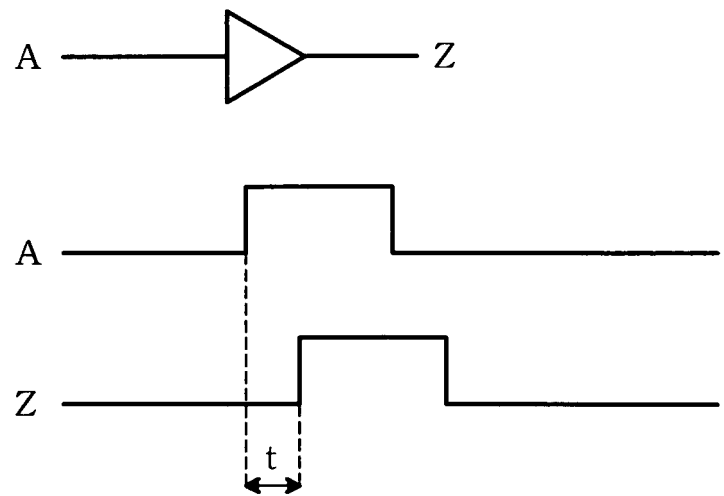
FIG. 1a illustrates the input signal and output signal of a traditional I/O pad, showing the I/O pad has the same function as a buffer.
Figure 1B:
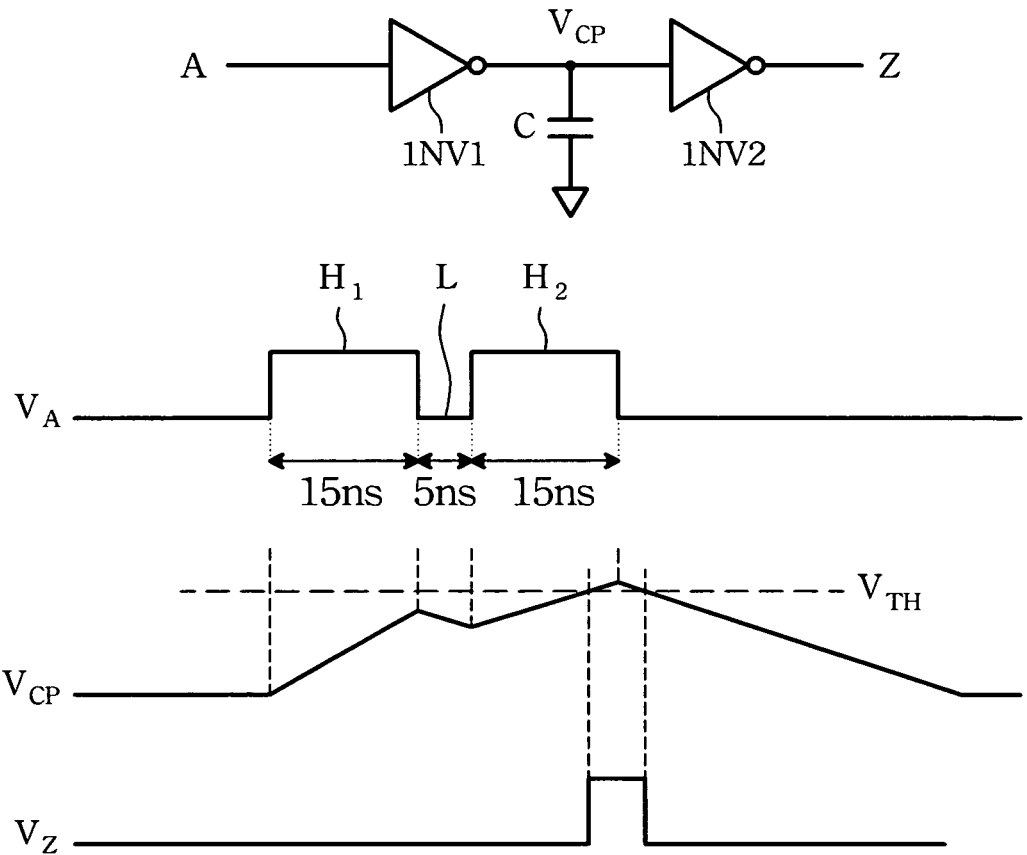
FIG. 1b illustrates the scheme of a traditional I/O pad connected to a low pass filter, besides, FIG. 1b also shows the voltage variation on the input terminal, output terminal, and the terminal voltage of the capacitor in the low pass filter, which show that an output pulse resulted from two successive input pulses, and malfunction is thereby resulted.
Figure 2:
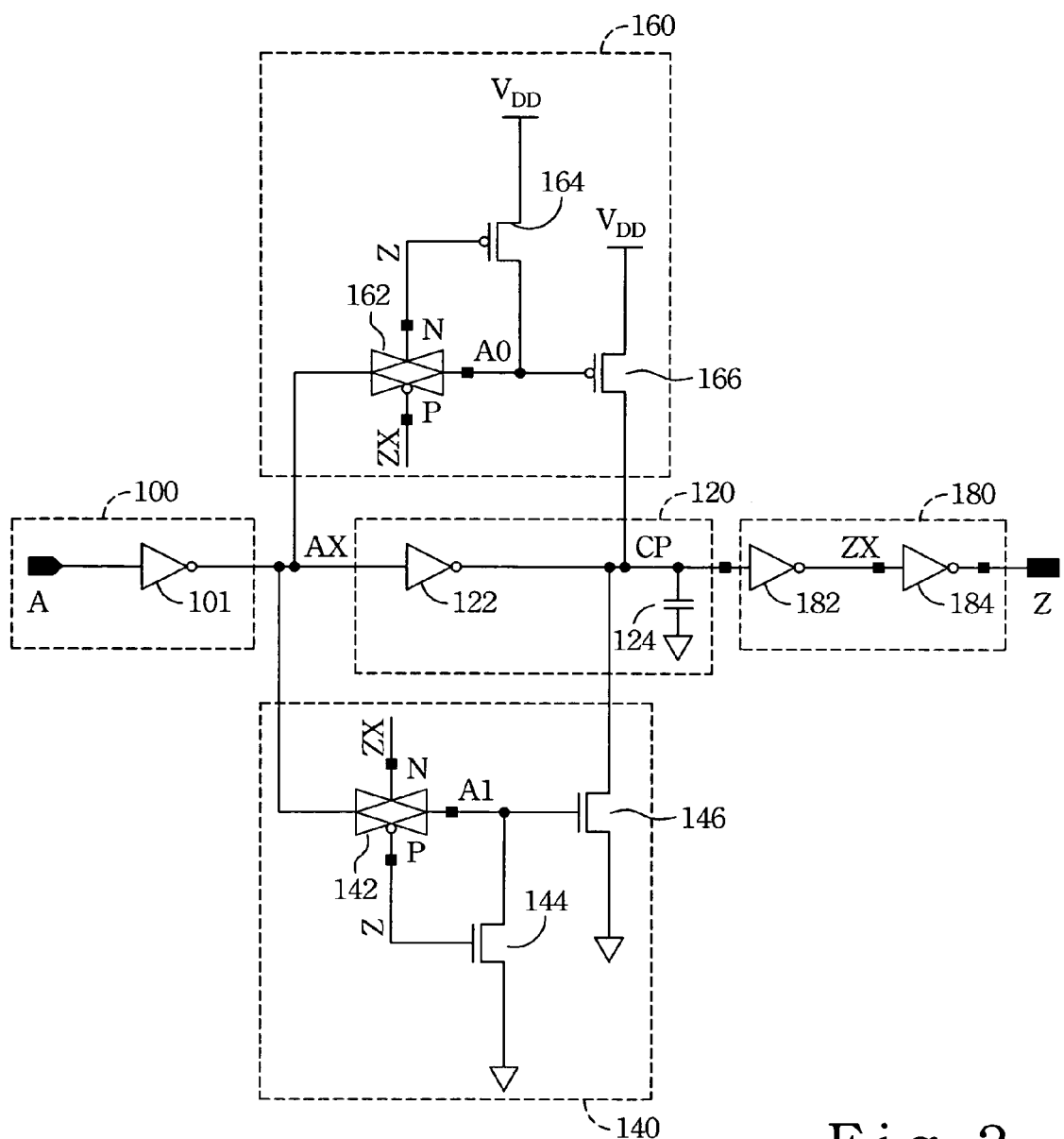
FIG. 2 is a schematic illustration of the de-glitch circuit of one of the preferred embodiments of the present invention.

The schematic illustration of the de-glitch circuit according to one of the preferred embodiments of the present invention is shown in FIG. 2, the circuit includes an input terminal inverting device 100, a low pass filter 120, a first short pulse reset circuit 140, a second short pulse reset circuit 160, and an output buffer set 180. The input terminal inverting device 100 includes a first inverter 101, and the low pass filter 120 includes a second inverter 122 and a capacitor 124. One terminal of the capacitor 124 is coupled to the output terminal of the second inverter 122, and the other terminal of the capacitor 124 is grounded. The first short pulse reset circuit 140 includes a first transmission gate 142, a first NMOS transistor 144, and a second NMOS transistor 146.

The input terminal of the first transmission gate 142 is coupled to the output terminal AX of the input terminal inverting device 100. The output terminal A1 of the first transmission gate 142 is coupled to the gate of the second NMOS transistor 146 having its' source grounded, and it's drain coupled to the output terminal CP of the second inverter 122. In addition, the output terminal A1 of the first transmission gate 142 is coupled to the drain of the first NMOS transistor 144 having its' source grounded. The first transmission gate 142 has a n control gate and a p control gate, which are fed with and respond to complementary signals ZX and Z respectively. The output of the second inverter 122 fed to an even number of inverters, thus generated the Z signal, and the Z signal is fed to the gate of the first NMOS transistor 144. By contrast, the output of the second inverter 122 fed to an odd number of inverters, thus generated the ZX signal.

The second short pulse reset circuit 160 includes a second transmission gate 162, a first PMOS transistor 164 and a second PMOS transistor 166, wherein the input terminal of the second transmission gate 162 is coupled to the output terminal AX of the input terminal inverting device 100. The output terminal A0 of the second transmission gate 162 is coupled to the gate of the second PMOS transistor 166 having its' source applied with voltage $V_{DD}$, and it's drain coupled to the output terminal CP of the second inverter 122. In addition, the output terminal A0 of the second transmission gate 162 is coupled to the drain of the first PMOS transistor 144 having its' source applied with voltage $V_{DD}$. The second transmission gate 162 has an n control gate and a p control gate, which are fed with and respond to complementary signals ZX and Z respectively. The Z signal is also fed to the gate of the first PMOS transistor. The buffer set 180 includes a third inverter 182 and a fourth inverter 184 in series connected. The signals ZX and Z are generated at the output of the inverters 182, 184, respectively, and are fed back to both the first short pulse reset circuit 140 and the second short pulse reset circuit 160.

Figure 3:
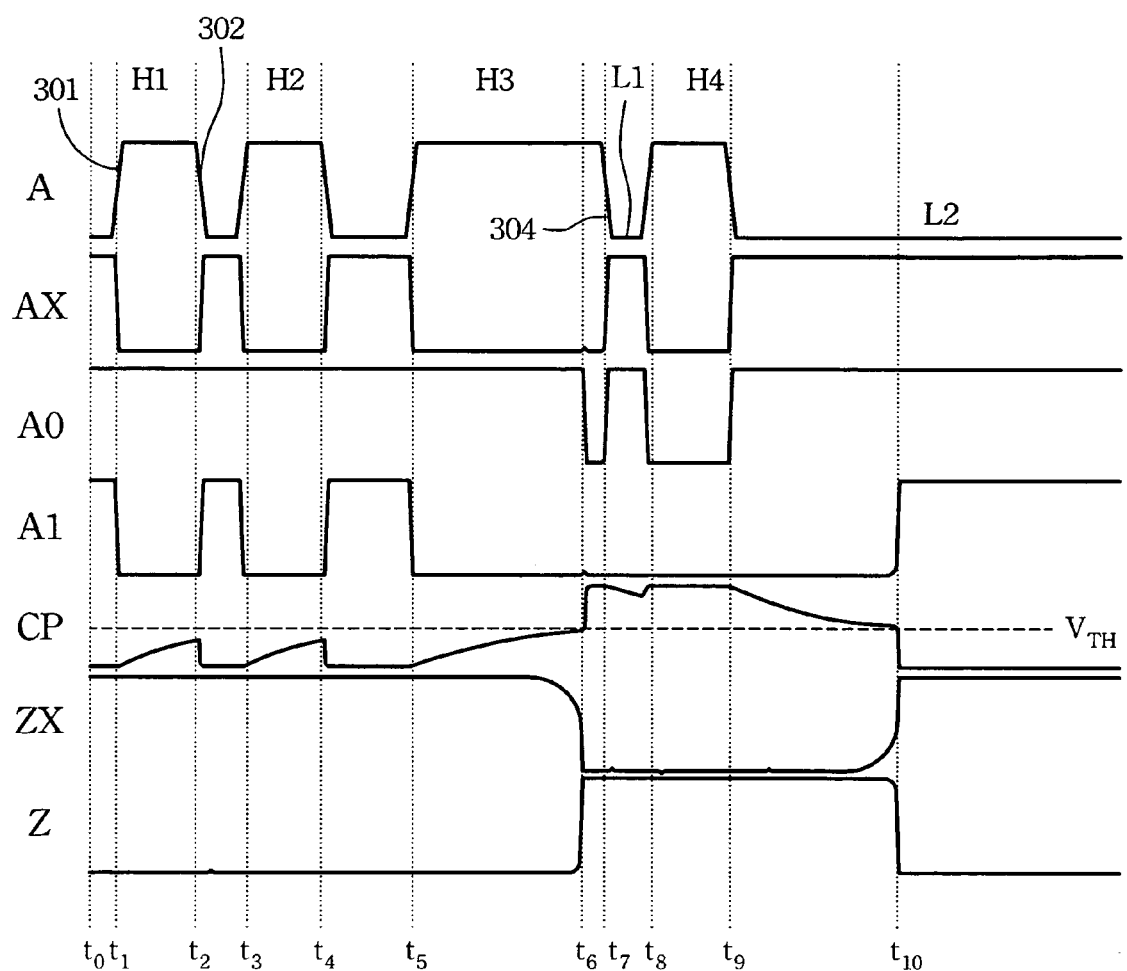
FIG. 3 illustrates the waveform (terminal voltage variation) on each terminal when applying a first input signal to the de-glitch circuit and its associated circuitry according one of the preferred embodiments of the present invention.

The principle of the operation of the circuit according to one of the preferred embodiments of the invention will be more precisely understood from consideration of the following descriptions in connection with the voltage variation (waveform) illustrated in FIG. 2 and FIG. 3.

Referring to the waveform of signal Z in FIG. 3, at time $t_0$, terminal A and signal Z are at low logic level (denoted as logic 0 hereinafter), and signal ZX is at high logic level (denoted as logic 1 hereinafter), and the voltage from signal Z will conduct the first transmission gate 142, in other words, enable the first transmission gate 142 to pass through signal. Thus the voltage at terminal AX is electrically coupled to the terminal A1, and the voltage on the terminal A1 is high logic level, so the second NMOS transistor 146 is in saturation mode and the terminal CP is electrically coupled to ground, simultaneously the signal Z remains at logic 0.

At time $t_1$, a glitch (pulse width being smaller than a preset value), such as left edge 301 of the pulse H1, the voltage of the terminal A change from 0 to 1 (denoted as 0→1), the voltage on terminal AX ($V_{AX}$) is 1→0, at this time, the first transmission gate 142 is conductive and the terminal A1 is electrically coupled to the terminal AX, so the voltage on the terminal A1 is 1→0, thus the second NMOS transistor 146 is off and the voltage on the terminal CP will not be lowered by the second NMOS transistor 146.

Simultaneously, the second transmission gate 162 is off ($V_Z$=0, $V_{ZX}$=1) $V_Z$=0, because the first PMOS transistor 164 is on (saturation mode), the terminal A0 is electrically coupled to $V_{DD}$ (applied with voltage $V_{DD}$), $V_{A0}$=$V_{DD}$. In addition, the second PMOS transistor 166 is off (cut off mode, i.e., electrically open), and the capacitor 124 is charged through the second inverter 122. As shown in FIG. 3, the capacitor 124 is charged for the duration of pulse H1, and the charging stops at the right edge 302. As shown in FIG. 3, under the condition that the pulse width of the pulse H1 being short enough, the voltage of terminal CP ($V_{CP}$) will not have enough time to raise to reach the threshold ($V_{TH}$), thus the voltage on the terminal CP is not high enough to activate the third inverter 182, so $V_Z$=0, and $V_{ZX}$ remained at 1. In other words, the second transmission gate 162 and the first transmission gate 142 remained their original status.

At time t2, the right edge 302 of pulse H1 falls, and the voltage on terminal A is 1→0, AX is 0→1, once the voltage on the terminal AX is 0→1 at the time when the voltage on terminal A1 equals to 1, the capacitor 124 will immediately be reset (discharged to 0).

During the time frame of pulse H2, from $t_3$ to $t_4$, as the operation of each device is the same as that of the time frame from $t_1$ to $t_2$, i.e., duration of pulse H1, so the detailed descriptions are omitted for the purpose of conciseness.

If the input signal is not a glitch, referring to the pulse H3 in FIG. 3, at time t5 (just like at time t1), the voltage at terminal AX is 1→0, at this time, the first transmission gate 142 being at its' ON status (i.e., electrically short circuited). As a result, the terminal AX is electrically coupled to terminal A1, so the voltage on terminal A1 is 1→0, and thus the second NMOS transistor 146 is off. In addition, the capacitor 124 is charged through the second inverter 122, due to the width of the pulse H3 is very long, the capacitor 124 continued to be charged to exceed the threshold voltage $V_{TH}$ of the third inverter 182, thus activate the third inverter 182. So the transition of signal Z and ZX is resulted, thus $V_Z$ (voltage of signal Z) changes to 1, and $V_{ZX}$ changes to 0. The transition lagged behind the time $t_5$, instead, as shown in FIG. 3, it happened at time $t_6$. In addition, the transition of signal Z and ZX in the buffer set are fed back to both the first short pulse reset circuit 140 and the second short pulse reset circuit 160. As a result, the first transmission gate 142 will be turned off (electrically open status), and $V_{A1}$ remains at 0 (first NMOS transistor 144 being turned on to couple terminal A1 to ground, and the second NMOS transistor 146 remains off), on the contrary, the second transmission gate 162 is turned on. Because $V_{AX}=0$, thus $V_{AD}=0$, and the second PMOS transistor 166 will be turned on, as a result, the capacitor 124 will be charged to saturation, referring to the waveform on the terminal CP, the voltage at time t6 reached its' maximum value.

At time $t_7$, a short pulse L1 occurred (contrast to H1 and H2, it can be a kind of noise, pulse that from 1 to 0), and resulted a fall of the right edge 304, $V_A$ is 1→0, and $V_{AX}$ is 0→1, the status of the first transmission gate 142 is OFF, and the second transmission gate 162 remained its' ON status. Because $V_{A0}=1$, the second PMOS transistor 166 is turned off, and the capacitor 124 discharged slowly through the second inverter 122. Because the width of the pulse L1 is not long enough, $V_{CP}$ is still higher than the threshold voltage of the third inverter 182 at the time when the pulse H4 applied to the terminal A, thus the transition of signal Z and ZX will not happen. As shown in FIG. 3, the width of the pulse in the signal Z is the summation of the pulse H3, L1 and H4, which equals to $t_{10}$ minus $t_6$, also equals to $t_9$ minus $t_5$.

The pulse L2 appears at time $t_9$, because the width of the pulse L2 is long enough, the capacitor 124 slowly discharge through the second inverter 122, making the voltage on the terminal CP lower than the threshold voltage of the third inverter 182. So transition happened in both signal Z and ZX, turning the first transmission gate 142 on, and the second NMOS transistor 146 is turned on to provide a path for the capacitor 124 to rapidly discharge.

According to one of the preferred embodiments of the present invention, L2 is treated as a noise with its' pulse-width related to the ratio of channel width W to the length L of the second inverter 122, and the capacitor 124. The maximum pulse-width of the acceptable noise can be determined by the time frame from the capacitor 124 being discharged, through the second inverter 122, from saturation to the threshold voltage of the third inverter 182, i.e., the time frame for $V_{CP}$ to drop from saturation voltage to $V_{TH}$.

Figure 4:
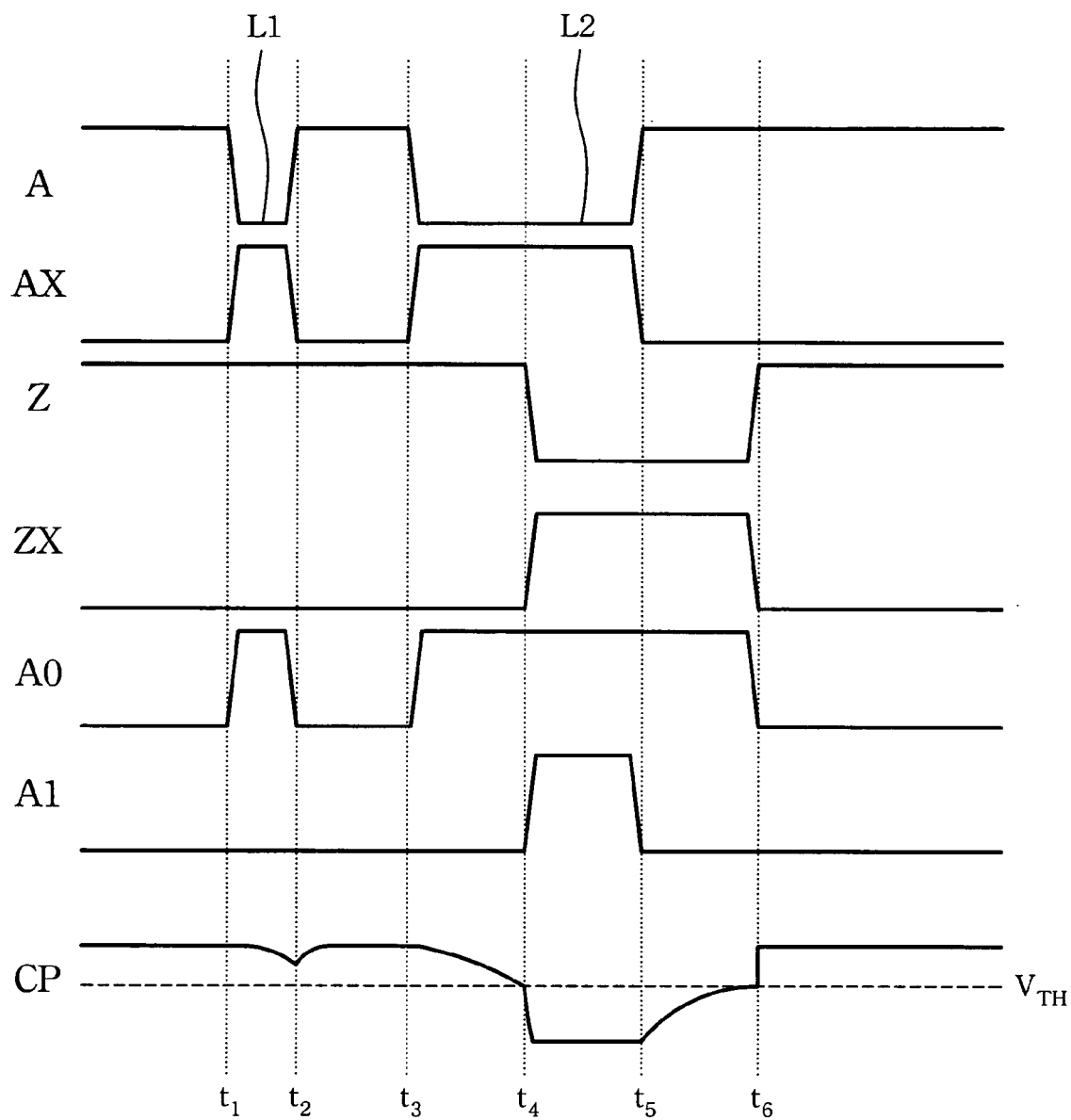
FIG. 4 illustrates the waveform (terminal voltage variation) on each terminal when applying a second input signal to the de-glitch circuit and its associated circuitry according one of the preferred embodiments of the present invention.

Furthermore, if the initial condition is $V_A=1$ and $V_Z=1$, referring to FIG. 4, at time t1, the first transmission gate 142 is off, terminal A1 is grounded due to the ON status of the first NMOS transistor 144, thus resulted in the OFF status of the second NMOS transistor 146. By contrast, the second transmission gate 162 is turned on, and the second PMOS transistor 166 is turned on to make the terminal voltage $V_{CP}$ of the capacitor 124 remained at high logic level.

When a short pulse L1 appeared at the terminal A, the first transmission gate 142 remained OFF, and the second transmission gate 162 remained ON, in addition, the voltage on terminal A0 changes from 0 to 1, thus the second PMOS transistor 166 is turned off. As a result, the capacitor 124 discharge through the second inverter 122 and $V_{CP}$ decreased gradually. Because the pulse-width of the pulse L1 is very short, been pulled up by the capacitor 124, the terminal voltage $V_{CP}$ of the capacitor 124 rises before it fall to a value not higher than the threshold voltage $V_{TH}$ of the third inverter 182. When a long pulse L2 is applied to the input terminal A, the capacitor 124 is discharged and its' terminal voltage $V_{CP}$ is thus lower than the threshold voltage of the third inverter 182, and resulted in the transition in both signal Z and ZX. In other words, because the first transmission gate 142 is on, and the second transmission gate 162 is off, the capacitor 124 will be "reset", i.e., the charge on the capacitor 124 will be rapidly discharged through the second NMOS transistor 146, which is in its' ON status.

It is noted that when the first transmission gate 142 is on (in its' ON status), the voltage on terminal A1 varies with the voltage on terminal AX, when the first transmission gate 142 is off (OFF status), the voltage on terminal A1 will be grounded, thus the second NMOS transistor 146 is turned off, so the capacitor 124 is thus being rapidly reset. The voltage on the terminal A0 varies with the voltage on the terminal AX when the second transmission gate 162 is on. On the contrary, when the second transmission gate 162 is off, the voltage on the terminal A0 will be raised to $V_{DD}$, and the second PMOS transistor 166 will be turned off. As illustrated in FIG. 4, at time $t_5$, the capacitor 124 can only be charged through the second inverter 122 to exceed $V_{TH}$, thus enabling the transition of signal Z and ZX, which happened at time $t_6$ in both signal Z and ZX.

Accordingly, the circuit in one of the preferred embodiments of the present invention through the selection of the second inverter 122 and the capacity of the capacitor 124, the pulse-width of the pulse that is to be filtered (pulse width being smaller than a predetermined value) can be determined. In addition, no matter the glitch changes from high logic level to low logic level, or from low to high level, it can fit the circuit in the present invention. In addition, in the prior art, when two noise are close enough (time duration between two glitch being shorter than a predetermined value), the circuit will suffer from charge accumulation resulting from insufficient discharge of capacitor, so the present invention utilize the rapid charge/discharge characteristic of transistor to reset capacitor, thus resolve the problem resulted from charge accumulation.

While there have been described above the principles of the present invention in conjunction with specific devices, it is to be clearly understood that the foregoing description is made only by way of example and not as a limitation to the scope of the invention, Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. Apparatus for filtering glitch, said apparatus comprising:
an input terminal inverting device for generating a first inverted input signal responding to an input signal, the first inverted input signal and the input signal being complementary;
an output buffer set for generating a first feedback signal and a second feedback signal, the first feedback signal and the second feedback signal being complementary;
a low pass filter comprising a capacitor and a first inverter, wherein the first inverter is coupled to the output terminal of the input terminal inverting device, one terminal of the capacitor being grounded;
a first glitch reset circuit having a first terminal grounded and a second terminal and a third terminal thereof coupled with an input terminal and an output terminal, respectively, of the low pass filter; and
a second glitch reset circuit having a fourth terminal connected to a power and having a fifth terminal and a sixth terminal thereof coupled with the input terminal and the output terminal, respectively, of the low pass filter, furthermore, the first glitch reset circuit performing responding to the first feedback signal and the second feedback signal, so that the capacitor is rapidly charged through the second glitch reset circuit when the capacitor is charging and has a voltage thereof exceeding a threshold voltage of the output buffer set resulted in exchanging logic levels of the first feedback signal and the second feedback signal, furthermore, the first glitch reset circuit performing responding to the first feedback signal and the second feedback signal, the capacitor being rapidly discharged through the first glitch reset circuit when the capacitor is charging but has the voltage thereof lower than the threshold voltage of the output buffer set to keep the logic levels of the first feedback signal and the second feedback signal the same.

2. The apparatus as claim 1, wherein the third terminal is coupled to input terminal of the output buffer set, the first glitch reset circuit including a first NMOS transistor, a second NMOS transistor and a first transmission gate, furthermore, the second terminal and the third terminal are, respectively, a first control terminal and a second control terminal of the first transmission gate.

3. The apparatus as claim 2, wherein the first terminal is source terminals of the first NMOS transistor and the second NMOS transistor, further, the second terminal and the third terminal are an input terminal of the first transmission gate, and a drain terminal of the second NMOS transistor, respectively, still further, an output terminal of the first transmission gate are coupled to a gate terminal of the second NMOS transistor and to a drain terminal of the first NMOS transistor, furthermore, the first control terminal is an N control gate of the first transmission gate and the second control terminal is a P control gate of the first transmission gate and a gate of the first NMOS transistor.

4. The apparatus as claim 1, wherein the second glitch reset circuit comprises a first PMOS transistor, a second PMOS transistor, and a second transmission gate.

5. The apparatus as claim 4, wherein the fourth terminal is source terminals of the first PMOS transistor and the second PMOS transistor, further, the fifth terminal and the sixth terminal are an input terminal of the second transmission gate, and a drain terminal of the second PMOS transistor, respectively, still further, an output terminal of the second transmission gate are coupled to a gate terminal of the second PMOS transistor and to a drain terminal of the first PMOS transistor, furthermore, the first control terminal is a P control gate of the second transmission gate and the second control terminal is a N control gate of the second transmission gate and a gate of the first PMOS transistor.

6. The apparatus as claim 1, wherein the output buffer set has an even number of inverters, output of an odd number of inverters being provided as the first feedback signal, the output of the even number of inverters being provided as the second feedback signal.

7. The apparatus as claim 1, wherein the glitch has a maximum pulse width that determined by the first inverter and capacitance of the capacitor.

8. Apparatus for filtering glitch, said apparatus comprising: an input terminal inverting device;
an output buffer set for generating a first feedback signal and a second feedback signal, the first feedback signal and the second feedback signal being complementary;
a low pass filter comprising a capacitor and a first inverter, wherein the first inverter is coupled to the input terminal inverting device, one terminal of the capacitor being grounded, and the other terminal of the capacitor being coupled to an input terminal of the output buffer set;
a first glitch reset circuit providing a rapidly discharge path for the capacitor, wherein the first glitch reset circuit has a first input terminal coupled to the input terminal inverting device, and a first output terminal coupled to the input terminal of the output buffer set, the first glitch reset circuit including a first NMOS transistor, a second NMOS transistor, and a first transmission gate having two control gates controlled by the first feedback signal and the second feedback signal, respectively; and
a second glitch reset circuit providing a rapidly charge path for the capacitor, wherein the second glitch reset circuit has a second input terminal coupled to the input terminal inverting device, and a second output terminal coupled to the input terminal of the output buffer set, the second glitch reset circuit comprises a first PMOS transistor, a second PMOS transistor, and second transmission gate having two control gates controlled by the first feedback signal and the second feedback signal respectively, when the first feedback signal and the second feedback signal turn on the first transmission gate, they turn off the second transmission gate at a time, similarly, when they turn off the first transmission gate, they turn on the second transmission gate.

9. The apparatus as claim 8, wherein the first transmission gate has an input terminal coupled to the input terminal inverting device, the first transmission gate has an output terminal coupled to a gate of the second NMOS transistor and to a drain of the first NMOS transistor, a source of the second NMOS transistor being grounded, the drain of the second NMOS transistor being coupled to the input terminal of the output buffer set, the source of the first NMOS transistor being grounded an N control gate of the first transmission gate being controlled by the first feedback signal a P control gate and the gate of the first NMOS transistor being controlled by the second feedback signal.

10. The apparatus as claim 8, wherein the second transmission gate has an input terminal coupled to the input terminal inverting device, the second transmission gate has an output terminal coupled to a gate of the second PMOS transistor and to a drain of the first PMOS transistor a source of the second PMOS transistor being coupled to power supply, the drain of the second PMOS transistor being coupled to the input terminal of the output buffer set, the source of the first PMOS transistor being coupled the power supply, a P control gate of the second transmission gate being controlled by the first feedback signal, an N control gate and the gate of the first PMOS transistor being controlled by the second feedback signal.

11. The apparatus as claim 8, wherein the output buffer set has an even number of inverters, output of an odd number of inverters being provided as the first feedback signal, the output of the even number of inverters being provided as the second feedback signal.

12. The apparatus as claim 8, wherein the glitch has a maximum pulse width that determined by the first inverter and capacitance of the capacitor.

* * * * *